US007208396B2

(12) United States Patent
Felmetsger

(10) Patent No.: US 7,208,396 B2
(45) Date of Patent: Apr. 24, 2007

(54) PERMANENT ADHERENCE OF THE BACK END OF A WAFER TO AN ELECTRICAL COMPONENT OR SUB-ASSEMBLY

(75) Inventor: Valery V. Felmetsger, Goleta, CA (US)

(73) Assignee: Tegal Corporation, Petaluma, CA (US)

( * ) Notice: Subject to any disclaimer, the term of this patent is extended or adjusted under 35 U.S.C. 154(b) by 454 days.

(21) Appl. No.: 10/051,886

(22) Filed: Jan. 16, 2002

(65) Prior Publication Data
US 2003/0132524 A1 Jul. 17, 2003

(51) Int. Cl.
*H01L 21/20* (2006.01)

(52) U.S. Cl. .................. 438/504; 438/505; 438/735; 438/798

(58) Field of Classification Search ............ None
See application file for complete search history.

(56) References Cited

U.S. PATENT DOCUMENTS 5,096,536 A * 3/1992 Cathey, Jr. .............. 438/715

(Continued)

FOREIGN PATENT DOCUMENTS

EP 0010971 5/1980

(Continued)

OTHER PUBLICATIONS

"Pit corrosion inhibition in Sputtered Thin Films", Apr. 1, 1993, IBM Technical Disclosure Bulletin, vol. 36, pp. 405 and 406.*

(Continued)

*Primary Examiner*—Alonzo Chambliss
(74) *Attorney, Agent, or Firm*—Fliesler Meyer LLP

(57) ABSTRACT

A plurality of successive layers are firmly adhered to one another and to a wafer surface and an electrical component or sub-assembly even when the wafer surface is not even and the layers are bent. The wafer surface is initially cleaned by an ion bombardment of an inert gas (e.g. argon) on the wafer surface in an RF discharge at a relatively high gas pressure. The wafer surface is then provided with a microscopic roughness by applying a low power so that the inert gas (e.g. argon) ions do not have sufficient energy to etch the surface. A layer of chromium is then sputter deposited on the wafer surface as by a DC magnetron with an intrinsic tensile stress and low gas entrapment by passing a minimal amount of the inert gas through the magnetron and by applying no RF bias to the wafer. The chromium layer is atomically bonded to the microscopically rough wafer surface. A layer of a nickel-vanadium alloy is deposited on the chromium layer and a layer of a metal selected from the group consisting of gold, silver and copper is deposited on the nickel-vanadium layer. The nickel-vanadium layer is deposited between the chromium layer and the metal layer with an intrinsic compressive stress by applying an RF bias to the wafer to neutralize the intrinsic tensile stress of the chromium layer and any intrinsic stress of the metal layer. The electrical component is adhered as by solder to the metal selected from the group consisting of gold, silver and copper.

44 Claims, 2 Drawing Sheets

U.S. PATENT DOCUMENTS

| | | | |
|---|---|---|---|
| 6,130,170 A | 10/2000 | David et al. | |
| 6,294,444 B1 * | 9/2001 | Ueno | 438/514 |
| 6,375,810 B2 * | 4/2002 | Hong | 204/192.12 |
| 6,399,411 B1 * | 6/2002 | Hori et al. | 438/62 |
| 6,806,173 B1 * | 10/2004 | Spitz et al. | 439/559 |
| 2003/0017628 A1 * | 1/2003 | Li et al. | 438/14 |
| 2003/0068898 A1 * | 4/2003 | Lee et al. | 438/712 |
| 2004/0063298 A1 * | 4/2004 | Aga et al. | 438/406 |

FOREIGN PATENT DOCUMENTS

| | | |
|---|---|---|
| EP | 1306896 A1 * | 5/2003 |
| GB | 2106714 A | 4/1983 |
| JP | 2002033325 A * | 1/2002 |
| WO | WO01/84619 A2 | 11/2001 |

OTHER PUBLICATIONS

"Multilayer Ground Plane Fabrication", Apr. 1, 1969, IBM Technical Disclosure Bulletin, vol. 11, pp. 1596-1597.*

D.B. Beach, "Design of low-temperature thermal chemical vapor deposition processes", IBM J. REs. Develop., Nov. 1990, vol. 34, No. 6,.*

Valery Felmetsger, "Tailoring Sputtered Cr Films on Large Wafers", 1999, Sputtered Films, Inc., pp. 1-8.*

Valery Felmetsger, "Stress Control in multi-Layer Backside Metallization of Thinned Wafers", Oct. 1999, Sputtered Films, Inc., pp. 1-15.*

* cited by examiner

PERMANENT ADHERENCE OF THE BACK END OF A WAFER TO AN ELECTRICAL COMPONENT OR SUB-ASSEMBLY

This invention relates to the preparation of a surface of a wafer to receive, in a permanent adherence, an electrical component or sub-assembly. More particularly, the invention relates to a method of treating the surface of a wafer to receive the deposition of successive layers of material which make the wafer and the electrical component compatible so that the electrical component becomes permanently adhered to the wafer surface. The invention further relates to the method of applying the successive layers to the wafer to make the wafer surface and the electrical component or sub-assembly compatible for the permanent adherence of the electrical component to the wafer surface. The invention additionally relates to the construction and combination of the particular layers applied to the wafer surface to make the wafer surface compatible with the electrical component or sub-assembly.

BACKGROUND OF THE PREFERRED EMBODIMENT OF THE INVENTION

Integrated circuit chips have been used widely in recent years to form electrical circuits which provide functions not previously capable of being attained. The integrated circuits have been formed by providing substrates on which a plurality of layers have been deposited to form a wafer. Electrical components or sub-assemblies have then been attached to the wafers to form integrated circuits. The electrical components are ordinarily not compatible with the wafers to which they are attached. The wafer surface has accordingly been cleaned and prepared to receive successive depositions of materials which will make the wafer surface compatible with the electrical components or sub-assemblies. For example, successive operations may be as follows:

1. A cleaning of the wafer surface as by etching;
2. A deposition of a layer of chromium on the wafer surface;
3. A deposition of a layer of nickel vanadium on the layer of chromium;
4. A deposition on the layer of nickel vanadium of a layer of a metal selected from the group consisting of copper, gold and silver; and
5. A soldering of the electrical component to the layer of the metal selected from the group consisting of copper, gold and silver.

The use of the successive layers as discussed above has been practiced for some time. However, there are problems in the use of these successive layers. A major problem has been that the electrical component or sub-assembly has not been permanently adhered to the wafer even with the use of all of the different layers specified above. The lack of permanent adherence results in part from the heat produced by the soldering of the metal layer to the electrical component and from thermal shock. Lack of permanent adherence may be seen by scratching the surfaces of the different layers specified above and/or by bending the layers. A low adherence of the different layers leads to a lack of repeatability in the operating characteristics of the assembly including the wafer and the electrical component or assembly.

BRIEF DESCRIPTION OF A PREFERRED EMBODIMENT OF THE INVENTION

This invention provides for a firm adherence of an electrical component or sub-assembly to a surface of a wafer by providing a firm adherence between layers intermediate the wafer and the electrical component or sub-assembly. Furthermore, the firm adherence is provided even when the layers deposited between the wafer surface and the electrical component or sub-assembly are subjected to tests to separate the layers. These tests include bending the layers and scratching the layers bent to determine the permanent adherence of the wafer and the electrical component or sub-assembly.

In a preferred embodiment of the invention, a plurality of successive layers are firmly adhered to one another and to a wafer surface and an electrical component or sub-assembly even when the wafer surface is not even and the layers are bent. The wafer surface is initially cleaned by an ion bombardment of an inert gas (e.g. argon) on the wafer surface in an RF discharge at a relatively high gas pressure. The wafer surface is then provided with a microscopic roughness by applying a low power so that the inert gas (e.g. argon) ions do not have sufficient energy to etch the surface.

A layer of chromium is then sputter deposited on the wafer surface as by a DC magnetron with an intrinsic tensile stress and low gas entrapment by passing a minimal amount of the inert gas through the magnetron and by applying no RF bias to the wafer. The chromium layer is atomically bonded to the microscopically rough wafer surface. A layer of a nickel-vanadium alloy is deposited on the chromium layer and a layer of a metal selected from the group consisting of gold, silver and copper is deposited on the nickel-vanadium layer. The nickel-vanadium layer is deposited between the chromium layer and the metal layer with an intrinsic compressive stress by applying an RF bias to the wafer to neutralize the intrinsic tensile stress of the chromium layer and any intrinsic stress of the metal layer. The electrical component is adhered as by solder to the metal selected from the group consisting of gold, silver and copper.

DETAILED DESCRIPTION OF A PREFERRED EMBODIMENT OF THE INVENTION

In a preferred embodiment of the invention, a wafer generally indicated at 10 (FIG. 1) may include a layer 12 illustratively formed from pure silicon, silicon dioxide and doped silicon with different crystal orientations. The wafer 10 may include a transistor 16 having electrical circuitry formed from a plurality of layers successively deposited on the front surface of the layer 12 in a conventional manner.

Figure 1:
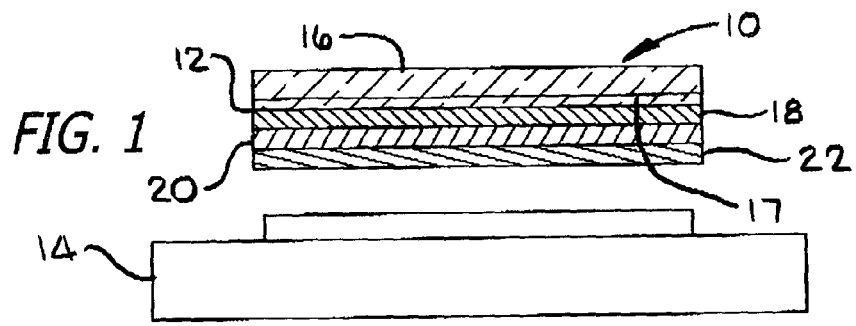
FIG. 1 is a schematic sectional view of a wafer having electrical circuits such as a transistor on a front surface and having layers of different materials deposited on a back surface to provide a compatible adherence between the back surface of the wafer and an electrical component or sub-assembly.

An electrical component or sub-assembly 14 is to be adhered to the back surface 17 of the layer 12. In this way, the transistor 16 and the electrical component or sub-assembly 14 can define electrical circuitry which performs specific functions. This electrical circuitry may be sufficient unto themselves to perform the specific functions or they may combine with other electrical circuitry to perform the specific functions. In FIG. 1, the component or sub-assembly 14 is shown before it is permanently adhered to the wafer 10.

The layer 12 and the electrical component or sub-assembly 14 are ordinarily not compatible with each other in the sense that the component or sub-assembly cannot be adhered directly to the layer 12. Because of this, the electrical component or sub-assembly is to be permanently adhered mechanically to the wafer 10. This lack of permanent adherence may be particularly troublesome when it is desired to provide an electrical continuity with little or no impedance between the wafer 10 and the electrical component or sub-assembly 14. Because of this, the electrical component or sub-assembly is to be permanently adhered mechanically to the wafer 10.

In order to provide such a compatibility, a plurality of successive layers have been deposited in sequence in the prior art on the surface 17 of the layer 12. These successive layers have included a layer 18 (FIG. 1) of chromium, a layer 20 of nickel vanadium and a layer 22 of a metal selected from the group consisting of copper, gold and silver. The electrical component or sub-assembly 14 is then soldered to the metal layer 22.

Each of the layers 18, 20 and 22 has been allegedly compatible in the prior art with the adjacent layers. For example, the chromium layer 18 has been allegedly compatible in the prior art with the layer 22 and the nickel vanadium layer 20, and the layer 12 formed from a metal selected from the group consisting of copper, silver and gold has been allegedly compatible with the nickel vanadium layer 20 and the component or sub-assembly 14.

Even when the additional layers have been added between the layer 12 and the electrical component or sub-assembly 14 in the prior art, there has often not been good adherence between the wafer 10 and the component or sub-assembly. For example, the lack of adherence may be seen by scratching one or more of the different layers specified or by bending the different layers. The lack of adherence between the different layers becomes particularly pronounced when the electrical component or sub-assembly 14 is soldered to the layer 22 selected from the group consisting of copper, nickel and gold. This results from the large amount of heat developed during the soldering operation.

The preferred embodiment of this invention provides a wafer 10 including the layer 12 and an electrical component or sub-assembly 14 and layers of chromium, nickel vanadium and a metal selected from the group consisting of copper, gold and silver, the same layers as have been provided in the prior art. However, in the preferred embodiment of the invention, the layers have been formed to adhere the layer 12 firmly and permanently to the electrical component or sub-assembly 14.

In the preferred embodiment of the invention, the surface 17 of the layer 12 is cleaned in a unique manner and the layers of chromium, nickel vanadium and the metal selected from the group consisting of copper, gold and silver are sequentially deposited in a unique manner on the layer 12, so that the electrical component or sub-assembly is firmly and permanently adhered to the wafer. The layers 18, 20 and 22 are formed to provide this firm and permanent adherence to the layer 12.

As a first step in the preferred embodiment in applicant's method, a thin layer is removed from the back surface 17 of the layer 12 to eliminate any impurities in the surface. This removal is provided by an RF discharge in a combination of electrical and magnetic fields in a manner well known in the art and discussed subsequently in connection with FIG. 4. The discharge is provided by a flow of molecules of an inert gas such as argon in the combined electrical and magnetic fields. The argon is ionized in the electrical and magnetic fields and the ions are attracted to the back surface 17 of the layer 12 to etch the layer surface. In the prior art, the argon molecules have been generally provided at a low gas pressure such as (1) $10^{-3}$ Torr and at a gas flow rate of approximately 15 standard cubic centimeters per minute (sccm). However, in applicant's preferred embodiment, the argon molecules are provided at a relatively high gas pressure such as approximately 4–6 $10^{-3}$ Torr and at a gas flow rate of approximately 40–50 sccm. This prevents the surface 10 from being atomically or microscopically smooth.

A high-power step is first provided to clean the surface 17 of the layer 12. In this high power step, approximately 600–1200 watts are applied between the waferland 24 (FIG. 2) and a grounded lens shield 25 by an RF voltage from a source 21. Molecules of an inert gas such as argon are provided at a flow rate of approximately 40–50 sccm and at a temperature of approximately 320° C. for a suitable period of time such as approximately 30 seconds. In this stage, impurities are removed from the wafer surface and an atomically rough surface is created on the wafer.

Figure 2:
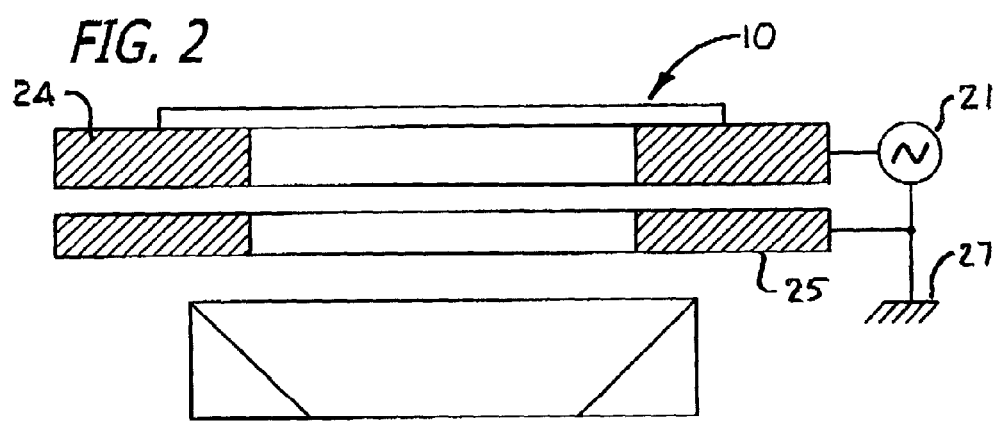
FIG. 2 is an enlarged schematic sectional view showing the wafer disposed on a waferland and showing a bias voltage applied to the waferland and a lens shield disposed on the waferland.

A subsequent step in the etching process provides for the creation of a microscopic or atomic roughness on the back surface 17 of the layer 12. This is provided in a relatively low power step involving the application of approximately 50–100 watts between the waferland 24 and an electrically grounded lens shield 25 in FIG. 2. In FIG. 2, the lens shield 25 is spaced from the waferland 24. Because of the relatively low power, the argon ions do not have sufficient energy to remove much material from the surface 17 of the layer 12. Instead, the argon ions have sufficient energy to create a microscopic or atomic roughness on the surface. The creation of the microscopic or atomic roughness on the surface 17 of the layer 12 may be obtained by providing a flow of argon at approximately 40–50 sccm for a period of approximately 60 seconds. The creation of the microscopic or atomic roughness on the wafer surface 10 constitutes an important feature of applicant's preferred method of the invention. The step discussed in this paragraph causes the roughness of the surface to be increased relative to the roughness produced in the wafer surface by the step in the previous paragraph.

As shown in FIG. 2, the wafer 10 is disposed on a waferland 24 and a lens shield 25 is disposed in abutting relationship to the waferland 24 and is grounded. The waferland 24 and the lens shield 25 are covered with a chromium layer to prevent atoms of the material of the waferland and the lens shield from contaminating the chromium layer which is subsequently applied to the wafer 10. The covering of the waferland 24 and the lens shield 25 with the chromium layer is believed to constitute one of the novel features of the preferred embodiment of this invention.

Figure 3:
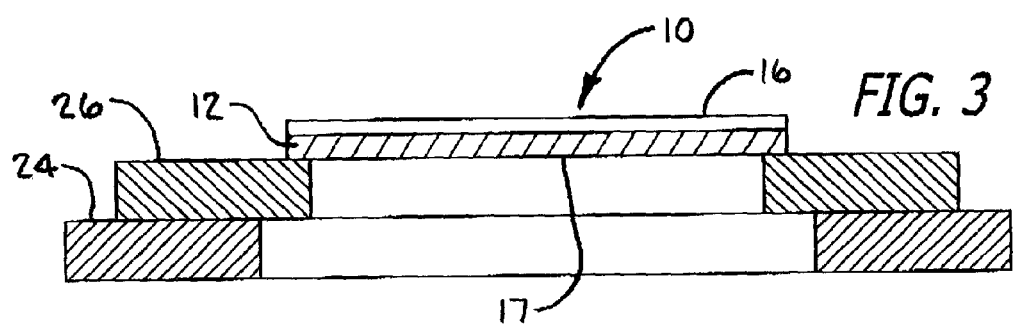
FIG. 3 is an enlarged schematic sectional view showing an adapter ring disposed between the wafer and the waferland when the waferland is oversized relative to the wafer.

When the waferland 24 is relatively large in comparison to the size of the wafer 10, an adapter ring 26 (FIG. 3) may be disposed on the waferland to adapt the size of the wafer to the size of the waferland. The adapter ring is also coated with a layer of chromium before the deposition of the chromium layer on the wafer 10 to prevent molecules of material from the adapter ring from contaminating the layers subsequently deposited on the chromium layer 18.

A layer 18 of chromium having a thickness such as approximately four hundred Angstrom (400 Å) is next deposited on the surface 17 of the layer 12. A good adhesion is provided between the chromium layer 18 and the back surface 17 of the layer 12 because of the microscopic or atomic roughness of the surface 17. This results from the fact that the microscopic roughness creates a good atomic or electrical bond with the chromium layer 18. The chromium layer 18 is deposited on the surface 17 of the layer 12 with a relatively low intrinsic stress. This stress may be tensile. The chromium layer 18 provides an adhesion to the surface 17 and to the nickel vanadium layer 20 which is subsequently deposited on the chromium layer.

The chromium layer 18 is deposited at a low rate of flow of an inert gas such as argon. This low rate may be in the order of 3–5 sccm. This prevents argon atoms from being entrapped in the layer 18. The presence of argon in the chromium layer 18 is not desirable because, during the soldering process, the argon molecules tend to destroy the adhesion of the chromium layer with the back surface 17 of the layer 12 and the nickel vanadium layer 20 subsequently deposited on the chromium layer. Power in the order of 4000 watts may be applied to the sputtering targets in the magnetron during the chromium deposition. The time for the formation of the chromium layer 18 may be in the order of 7 seconds.

The nickel vanadium layer 20 is deposited on the chromium layer 18, preferably in a thickness in the order of four thousand Angstrom (4000 Å). The nickel vanadium layer is deposited on the chromium layer with a low intrinsic stress. This intrinsic stress is compressive to counteract or balance the intrinsic tensile stress provided by the chromium layer 18. The nickel vanadium layer 20 is provided with a low intrinsic stress because the nickel vanadium is deposited on the chromium layer 18 with an RF bias power of approximately 300 watts between the waferland 24 and the lens land 25.

Figure 4:
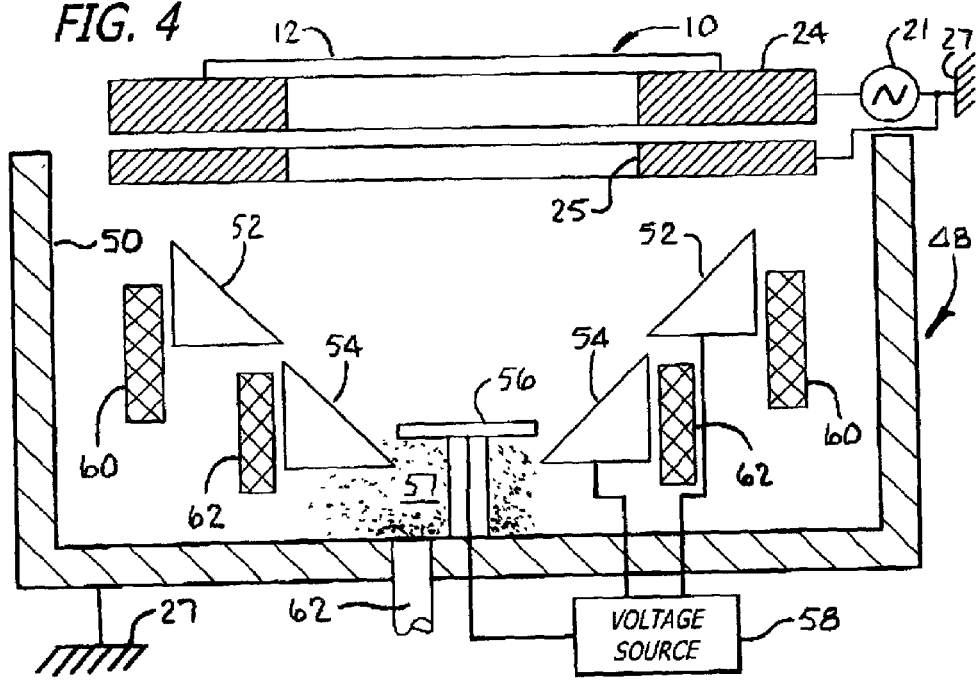
FIG. 4 is a schematic view in section of apparatus of the prior art for depositing layers of different materials on the back surface of the wafer to form the embodiment shown in FIG. 1.
Figure 5:
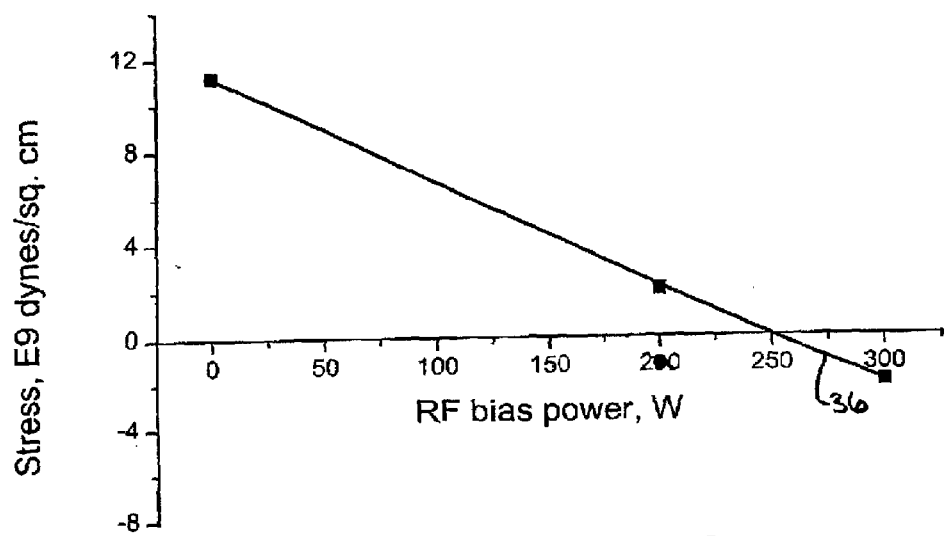
FIG. 5 provides curves showing the relationship between the RF bias power applied to the wafer and the intrinsic stress imposed upon the wafer when a nickel vanadium layer constituting one of the layers shown in FIG. 1 is deposited on the back surface of the wafer.

FIG. 5 is a curve 36 showing the relationship between RF bias power in watts along the horizontal axis and stress in E9 dynes per square centimeter along the vertical axis when the nickel vanadium layer 20 is deposited on the chromium layer 18. The curve 36 shown in FIG. 5 is provided for deposition equipment such as the equipment shown in FIG. 4. FIG. 5 shows how the stress in the nickel-vanadium layer 20 decreases with increases in the RF power applied.

The curve 36 in FIG. 5 is provided for a thickness of approximately 4000 Angstrom in the nickel vanadium layer 20. A zero stress is produced in the nickel vanadium layer 20 at an RF bias power of approximately 250 watts when the thickness of the nickel vanadium layer 20 is approximately 4000 Angstrom. As an example, a deposition of the nickel vanadium layer 20 may be provided with a power of approximately 6000 watts, with a flow rate of argon at approximately 5 sccm, with RF power of approximately 300 watts, with an anode voltage of approximately 60 volts and with a duration time of approximately 50 seconds.

The layer 22 of the metal selected from the group consisting of copper, gold and silver is thereafter deposited on the nickel vanadium layer 20. The layer 22 may be deposited in a conventional manner well known in the art. Preferably the thickness of the layer 22 is approximately five hundred Angstroms (500 Å). The layer 22 formed from the metal selected from the group consisting of copper, gold and silver is deposited on the nickel vanadium layer 20 with as low an intrinsic stress as possible. It is difficult to control the stress in the metallic layer 22 directly. Instead, the stress in the layer 22 is controlled by regulating the stress in the nickel vanadium layer 20. As will be appreciated, this can be accomplished by providing the layer 20 with the proper thickness. The method of depositing the layer 22 on the layer 20 can be the same as that performed in the prior art. For example, the power applied to obtain the deposition of a copper layer may be approximately 4000 watts; the argon may be provided at a flow rate of approximately 9 sccm; and the time for the deposition may be approximately 8 seconds.

To adhere the layer 22 to the component or sub-assembly 14, hot liquid solder is disposed on the surface of the component or sub-assembly. The solder may be an amalgam of tin and lead. While the solder is hot and liquid, the layer 22 is adhered to the component or sub-assembly 14 and is maintained in firm position on the component or sub-assembly until the solder solidifies and cools.

Tests have been conducted on depositions formed by the preferred methods of this invention and the depositions formed by the methods of the prior art. One test has involved the scratching of the depositions and the subsequent testing of the depositions for peeling. No peeling occurred in the depositions formed by the preferred method of this invention. From half peeling to complete peeling occurred in the depositions formed by the method of the prior art. Another test has involved the bending of the depositions. This test has been particularly provided to determine the adherence of the nickel vanadium layer relative to the adjacent layers of chromium and the metal selected from the group consisting of copper, gold and silver. The adhesion in the layer of the deposition formed by the methods of this invention continued at 100% even after the bending. However, the adherence decreased to approximately 36%–59% in the depositions produced by the methods of the prior art.

The layers 18, 20 and 22 may be deposited on the wafer surface 12 by conventional equipment. For example, this equipment is disclosed in U.S. Pat. No. 5,766,426 issued on Jun. 16, 1998, and assigned of record to the assignee of record of this application. This equipment is schematically illustrated in FIG. 4 and is generally indicated at 48 in FIG. 4. This equipment may include the waferland 24 for receiving the wafer. If the waferland 24 is outsized relative to the wafer, the wafer 10 may be disposed on the adaptor ring 26 (FIG. 3) and the adaptor ring may be disposed on the waferland. An RF voltage may be applied to the waferland 24 from one terminal of the RF supply 21, the other terminal of which is grounded as at 27. A shield 50 may be disposed in contiguous relationship to the waferland 24 and may be grounded. The shield may be grounded as at 27 to limit any stray movements of charged particles.

Targets 52 and 54 may be spaced from the shield 50 and may be provided with a suitable configuration such as a hollow frusto-conical configuration. The target 52 may be more closely spaced to the shield 50 than the target 54 and may be disposed on the same axis as the target 54. The target 52 may be provided with a greater radius than the target 54.

The targets 52 and 54 may be made from the material which is to be deposited in a layer on the surface 12 of the layer. For example, the targets 52 and 54 may be made from chromium when the chromium layer 18 is to be deposited on the surface 17 of the layer 12.

An anode 56 is disposed in a spaced relationship from the target 54, preferably in a coaxial relationship with the targets 52 and 54. A cavity 57 is produced between the anode 56 and the targets 52 and 54. A positive voltage may be produced between the anode 56 and the targets 52 and 54 as from a voltage source 58. This voltage difference between the anode and the targets 52 and 54 produces an electrical field. The electrical field causes electrons to be produced in the cavity 57 defined by the anode 56 and the targets 52 and 54. Magnets 60 and 62 may be respectively disposed relative to the targets 52 and 54 to produce magnetic fields in a substantially perpendicular relationship to the electrical field between the anode 56 and the targets 52 and 54.

Molecules of an inert gas such as argon are introduced as at 62 into the cavity 57 where the electrical and magnetic fields are provided. These molecules are ionized by the electrons in the cavity 57. The ionization of the argon molecules is facilitated because the electrons travel in a spiral path in the cavity as a result of the perpendicular relationship between the magnetic and electrical fields. The positive ions produced from the argon molecules travel to the targets 52 and 54 and cause atoms to be sputtered from the surfaces of the targets. These atoms move to the exposed surface 17 on the back of the layer 12 and become deposited on this surface.

Although this invention has been disclosed and illustrated with reference to particular preferred embodiments, the principles involved are susceptible for use in numerous other embodiments which will be apparent to persons of ordinary skill in the art. The invention is, therefore, to be limited only as indicated by the scope of the appended claims.

What is claimed is:

1. In a method of etching a surface of a wafer with a microscopic roughness to prepare the wafer surface for receiving a deposition of a material on the wafer surface, the steps of
   removing a thin layer from the surface of the wafer to eliminate any impurities from the surface of the wafer, wherein the material of the thin layer is the same as the material of the remaining wafer, and
   thereafter creating the microscopic roughness on the surface of the wafer to receive a deposition of the material on the surface by providing ions of an inert gas by physical RF plasma etch with an insufficient energy to etch the surface of the wafer but with a sufficient energy to create the microscopic roughness on the surface of the wafer.

2. In a method as set forth in claim 1 wherein the inert gas is argon.

3. In a method as set forth in claim 1
   wherein the wafer is disposed on a waferland and
   wherein a layer of chromium is deposited on the waferland after the microscopic roughness has been produced on the surface of the wafer.

4. In a method as set forth in claim 1
   wherein the inert gas is argon and
   wherein the wafer is disposed on a waferland and
   wherein a layer of chromium is deposited on the waferland after the microscopic roughness has been produced on a the surface of the wafer.

5. In a method as set forth in claim 1 wherein the inert gas pressure is about $4 \times 10^{-3}$ Torr.

6. In a method as set forth in claim 1 wherein the inert gas flow is between 40 to 50 sccm.

7. In a method as set forth in claim 1 wherein the energy provided to the ions of the inert gas is between 50 to 100 W.

8. In a method as set forth in claim 1 wherein the microscopic roughness is an atomic-scaled roughness.

9. In a method of providing for an attachment of an electrical component to a wafer, the steps of:
   removing a thin layer from the surface of the wafer by ions of inert gas by physical RF plasma etch,
      wherein the material of the thin layer is the same as the material of the remaining wafer,
   thereafter providing the surface of the wafer with a microscopic roughness,
   thereafter depositing a layer of chromium on the microscopically rough surface of the wafer with a low intrinsic tensile stress, and
   thereafter depositing a layer of nickel vanadium on the surface of the wafer with a low intrinsic compressive stress.

10. In a method as set forth in claim 9
    wherein a layer of a metal selected from a group consisting of gold, silver and copper is deposited on the surface of the nickel vanadium layer and
    wherein a component is soldered to the layer of the metal selected from the group consisting of copper, gold and silver.

11. In a method as set forth in claim 10
    wherein the layer of the chromium is deposited on the microscopically rough surface of the wafer with no RF bias.

12. In a method as set forth in claim 11
    wherein the layer of chromium is deposited on the microscopically rough surface of the wafer at a low rate of flow of an inert gas and
    wherein an RF bias power is applied during the deposition of the nickel vanadium layer on the chromium layer to produce the low intrinsic compressive stress in the nickel vanadium layer.

13. In a method as set forth in claim 9
    wherein the layer of chromium is deposited on the microscopically rough surface of the wafer at a low rate of the flow of an inert gas.

14. In a method as set forth in claim 9
    wherein the layer of the chromium is deposited on the microscopically rough surface of the wafer with no RF bias and
    wherein the layer of chromium is deposited on the microscopically rough surface of the wafer at a low rate of flow of an inert gas and
    wherein an RF bias power is applied during the deposition of the nickel vanadium layer on the chromium layer to produce the low intrinsic compressive stress in the nickel vanadium layer.

15. In a method as set forth in claim 14
    wherein a layer of a metal selected from a group consisting of gold, silver and copper is deposited on the surface of the nickel vanadium layer and
    wherein the component is soldered to the layer of the metal selected from the group consisting of copper, gold and silver.

16. In a method as set forth in claim 9
    wherein the microscopic roughness on the surface of the layer is created by providing ions of an inert gas by physical RF plasma etch on the surface of the wafer with an insufficient energy to etch the surface of the wafer but with a sufficient energy to create the microscopic roughness on the surface of the wafer.

17. In a method as set forth in claim 9 wherein the microscopic roughness is an atomic-scaled roughness.

18. In a method of providing a deposition on a surface of a wafer, the steps of:
   removing a thin layer from the surface of the wafer to eliminate impurities from the surface of the wafer, wherein the material of the thin layer is the same as the material of the remaining wafer,
   creating a microscopic roughness on the surface of the wafer, and
   depositing a chromium layer with a low intrinsic tensile stress on the microscopically rough surface of the wafer.

19. In a method as set forth in claim 18
   wherein the chromium layer is deposited on the microscopically rough surface of the wafer in a chamber and
   wherein an inert gas having a low flow rate is passed through the chamber with no RF bias on the wafer, when the chromium layer is deposited on the microscopically rough surface of the wafer, to prevent molecules of the inert gas from being entrapped in the chromium layer.

20. In a method as set forth in claim 19
   wherein the inert gas is argon.

21. In a method as set forth in 20
   wherein the wafer is disposed on a waferland and
   wherein a layer of chromium is deposited on the waferland, before etching the wafer surface, to prevent the layer of chromium deposited on the wafer from being contaminated by the material from the waferland.

22. In a method as set forth in claim 19
   wherein the microscopic roughness is produced on the surface of the wafer by providing the molecules of the inert gas with an insufficient energy to etch the surface of the wafer but with a sufficient energy to create the microscopic roughness on the surface of the wafer.

23. In a method as set forth in claim 18
   wherein no RF bias is provided when the chromium layer is deposited on the surface of the wafer and
   wherein the chromium layer is deposited on the microscopically rough surface of the wafer in a chamber and
   wherein an inert gas having a low flow rate is passed through the chamber, when the chromium layer is deposited on the microscopically rough surface of the wafer, to prevent the inert gas from being entrapped in the chromium layer and
   wherein the inert gas is argon.

24. In a method as set forth in claim 18
   wherein the chromium layer is deposited with a low intrinsic tensile stress on the microscopically rough surface by providing the layer with no RF bias.

25. In a method as set forth in claim 18
   wherein the microscopic roughness is created on the surface of the wafer by providing ions of an inert gas by physical RF plasma etch on the surface of the wafer with an insufficient energy to etch the surface of the wafer but with a sufficient energy to create the microscopic roughness on the surface of the wafer.

26. In a method as set forth in claim 18 wherein the microscopic roughness is an atomic-scaled roughness.

27. In a method of preparing a wafer surface for receiving an electronic component, the steps of:
   removing a thin layer from the surface of the wafer, wherein the material of the thin layer is the same as the material of the remaining wafer,
   thereafter creating a microscopic roughness on the surface of the wafer by providing ions of an inert gas by physical RF plasma etch with an insufficient energy to etch the surface of the wafer but with a sufficient energy to create the microscopic roughness on the surface of the wafer, and
   thereafter depositing a chromium layer on the microscopically rough surface of the wafer in a chamber in which a minimal amount of an inert gas is passed through the chamber during the deposition to prevent molecules of the inert gas from being entrapped in the chromium layer.

28. In a method as set forth in claim 27
   wherein no wafer bias is produced on the wafer when the chromium layer is deposited on the surface of the wafer.

29. In a method as set forth in claim 28
   wherein the chromium layer is deposited on the surface of the wafer with a low amount of intrinsic tensile stress.

30. In a method as set forth in claim 27
   wherein the chromium layer is deposited on the surface of the wafer under tension with a low amount of stress.

31. In a method as set forth in claim 27 wherein the microscopic roughness is an atomic-scaled roughness.

32. In a method of providing a deposition on a surface of a wafer for receiving an electronic component on the wafer surface, the steps of:
   removing a thin layer from the surface of the wafer, wherein the material of the thin layer is the same as the material of the remaining wafer,
   creating a microscopic roughness on the surface of the wafer, and
   atomically bonding a chromium layer to the microscopically rough surface on the wafer.

33. In a method as set forth in claim 32
   wherein the chromium layer is deposited on the microscopically rough surface of the wafer with no RF bias.

34. In a method as set forth in claim 33
   wherein an intrinsic tensile stress is provided with a low value in the chromium layer and
   wherein the microscopic roughness on the surface of the wafer is provided by disposing the wafer in a chamber and by passing ions of an inert gas by physical RF plasma etch through the chamber with insufficient energy to etch the surface of the wafer but with sufficient energy to produce the microscopic roughness on the surface of the wafer.

35. In a method as set forth in claim 32, the step of:
   providing a low intrinsic tensile stress in the chromium layer.

36. In a method as set forth in claim 32
   wherein the microscopic roughness on the surface of the wafer is provided by disposing the wafer in a chamber and by passing ions of an inert gas by physical RF plasma etch through the chamber with insufficient energy to etch the surface of the wafer but with sufficient energy to produce the microscopic roughness on the surface of the wafer.

37. In a method as set forth in claim 32
   wherein the microscopic roughness is created on the surface of the wafer by providing ions of an inert gas by physical RF plasma etch on the surface of the wafer with an insufficient energy to etch the surface of the wafer but a sufficient energy to create the microscopic roughness on the surface of the wafer.

38. In a method as set forth in claim 32 wherein the microscopic roughness is an atomic-scaled roughness.

39. In a method of etching a surface of a wafer with a microscopic roughness, the steps of:

providing a flow of an inert gas in the order of forty (40) to fifty (50) standard cubic centimeters per minute through a chamber containing the wafer and at a relatively high gas pressure in the order of $4-6 \times 10^{-3}$ Torr to remove a thin layer from the surface of the wafer, thereafter providing a flow of an inert gas through the chamber at a flow rate of approximately forty (40) to fifty (50) standard cubic centimeters per minute and a power in the order of six hundred watts (600 W) to twelve hundred watts (1200 W) to remove impurities from the surface of the wafer and provide an atomically rough surface, disposing the wafer on a waferland, and then providing a flow of an inert gas at a rate of approximately 40–50 standard cubic centimeters per minute through the chamber at a low power in the order of fifty watts (50 W) to one hundred watts (100 W) to provide the surface of the wafer with the microscopic roughness.

40. In a method as set forth in claim 39 wherein the power applied in the chamber to remove the impurities from the surface of the wafer is in the order of 600–1200 watts for approximately thirty (30) seconds and wherein the flow of the inert gas through the chamber to provide the surface of the wafer with the microscopic roughness occurs for a period of approximately sixty (60) seconds.

41. In a method as set forth in claim 40 wherein a layer of chromium is deposited on the surface of the waferland before the surface of the wafer is etched.

42. In a method as set forth in claim 40 wherein the nickel vanadium layer is deposited on the chromium layer with a power of approximately six thousand watts (6000 W), with a flow rate of argon of approximately five (5) sccm and with RF power of approximately three hundred (300) watts.

43. In a method as set forth in claim 39 wherein a layer of chromium is deposited on the microscopically rough surface of the wafer without any RF bias and at a low flow rate of the inert gas.

44. In a method as set forth in claim 39 wherein a layer of nickel vanadium is deposited on the surface of the chromium layer with an RF bias power of approximately 300 watts and with a flow rate of argon of approximately 5 sccm.

\* \* \* \* \*